United States Patent
Li et al.

(10) Patent No.: US 9,704,891 B2
(45) Date of Patent: Jul. 11, 2017

(54) THIN FILM TRANSISTOR HAVING GERMANIUM THIN FILM AND MANUFACTURING METHOD THEREOF, ARRAY SUBSTRATE, DISPLAY DEVICE

(71) Applicant: BOE TECHNOLOGY GROUP CO., LTD., Beijing (CN)

(72) Inventors: Yanzhao Li, Beijing (CN); Long Wang, Beijing (CN); Yong Qiao, Beijing (CN); Yongchun Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/891,091

(22) PCT Filed: May 14, 2015

(86) PCT No.: PCT/CN2015/079001
§ 371 (c)(1),
(2) Date: Nov. 13, 2015

(87) PCT Pub. No.: WO2016/086608
PCT Pub. Date: Jun. 9, 2016

(65) Prior Publication Data
US 2016/0197274 A1     Jul. 7, 2016

(30) Foreign Application Priority Data
Dec. 3, 2014   (CN) .......................... 2014 1 0727563

(51) Int. Cl.
*H01L 21/00*     (2006.01)
*H01L 27/12*     (2006.01)
(Continued)

(52) U.S. Cl.
CPC ........ *H01L 27/124* (2013.01); *H01L 27/1222* (2013.01); *H01L 27/1285* (2013.01);
(Continued)

(58) Field of Classification Search
CPC ....... H01L 49/00; H01L 29/786; H01L 27/12; H01L 29/66
(Continued)

(56) References Cited

U.S. PATENT DOCUMENTS 5,620,906 A * 4/1997 Yamaguchi ......... H01L 21/3003
                                                257/E21.212
6,380,560 B1 * 4/2002 Yamazaki ............... H01L 29/04
                                                    257/290

(Continued)

FOREIGN PATENT DOCUMENTS

CN          1654707 A       8/2005
CN          103643287 A     3/2014
(Continued)

OTHER PUBLICATIONS

Akira Heya, "Improvement of Poly-Ge TFT Characteristics by Atomic Hydrogen Anneal" University of Hyogo, Department of Materials Science and Chemistry, 2167 Shosha, Himeji, 671-2280, Japan.*

(Continued)

*Primary Examiner* — Caleb Henry
(74) *Attorney, Agent, or Firm* — Dilworth & Barrese, LLP; Michael J. Musella, Esq.

(57) ABSTRACT

A thin film transistor and manufacturing method thereof, an array substrate and a display device are provided. In the manufacturing method of the thin film transistor, manufacturing an active layer includes: forming a germanium thin film, and forming pattern of the active layer through a patterning process; conducting a topological treatment on (Continued)

Forming a germanium thin film, and forming a pattern of an active layer by a patterning process — S103

Conducting topological treatment on the germanium thin film with a functionalized element, so as to obtain the active layer with topological semiconductor characteristics — S104 the germanium thin film with a functionalized element, so as to obtain the active layer (4) with topological semiconductor characteristics. The resultant thin film transistor has a higher carrier mobility and a better performance.

16 Claims, 3 Drawing Sheets

(51) Int. Cl.
      *H01L 29/66*     (2006.01)
      *H01L 29/786*   (2006.01)

(52) U.S. Cl.
      CPC .. *H01L 29/66742* (2013.01); *H01L 29/78684* (2013.01); *H01L 29/78696* (2013.01); *H01L 27/12* (2013.01)

(58) Field of Classification Search
      USPC .......................................... 438/151; 257/29
      See application file for complete search history.

(56) References Cited

U.S. PATENT DOCUMENTS

| | | | | |
|---|---|---|---|---|
| 8,304,780 | B2* | 11/2012 | Kamath | ................ H01L 21/316 257/262 |
| 2012/0161209 | A1 | 6/2012 | Yazdani | |
| 2013/0037798 | A1* | 2/2013 | Wong | ................. H01L 29/7869 257/43 |
| 2016/0189880 | A1* | 6/2016 | Wang | .................... H01G 11/24 429/232 |
| 2016/0197274 | A1* | 7/2016 | Li | ......................... H01L 49/003 257/29 |
| 2016/0202795 | A1* | 7/2016 | Wang | ..................... G06F 3/044 345/174 |
| 2016/0284394 | A1* | 9/2016 | Tominaga | ............... H01L 43/08 |
| 2016/0359077 | A1* | 12/2016 | Li | ....................... H01L 31/1804 |

FOREIGN PATENT DOCUMENTS

| | | |
|---|---|---|
| CN | 104099578 A | 10/2014 |
| CN | 104157698 A | 11/2014 |
| CN | 104392931 A | 3/2015 |
| KR | 20040008614 A | 1/2004 |

OTHER PUBLICATIONS

Search Report and Written Opinion Mailed Sep. 10, 2015 from State Intellectual Property Office of the P.R. China.

Chinese Office Action mailed Oct. 9, 2016.

Yong Xu et al, Large-Gap Quantum Spin Hall Insulators in Tin Films, Physical Review Letters vol. 111, Sep. 27, 2013, pp. 136804-1 to 136804-5.

Elisabeth Bianco et al., Stability and Exfoliation of Germannane A Germanium Graphane Analogue, ACS Nano vol. 7, No. 5, Mar. 19, 2013, pp. 4414 to 4421.

* cited by examiner

THIN FILM TRANSISTOR HAVING GERMANIUM THIN FILM AND MANUFACTURING METHOD THEREOF, ARRAY SUBSTRATE, DISPLAY DEVICE

TECHNICAL FIELD

Embodiments of the present invention relate to a thin film transistor and manufacturing method thereof, an array substrate and a display device.

BACKGROUND

The development of display industry at present leads to an increasingly increased demand on characteristics of thin film transistors (TFTs), it is required by high-resolution liquid crystal displays (LCDs) and large-size active matrix organic light-emitting diode displays (AMOLEDs) that TFT devices of an array substrate have a larger on-state current and a very high on-off ratio, and therefore, higher carrier mobility is better for TFT devices. However, mobility of TFTs at present remains lower than expected generally (being about 10 $cm^2$ $V^{-1}$ $S^{-1}$), and cannot meet the needs of progressive development of technology.

SUMMARY

A manufacturing method of a thin film transistor, which includes steps of manufacturing an active layer, wherein,
manufacturing the active layer includes:
forming a germanium thin film, and forming pattern of the active layer through a patterning process; and
conducting a topological treatment on the germanium thin film with a functionalized element, so as to obtain the active layer with topological semiconductor characteristics.

A thin film transistor including an active layer, which includes a thin film that contains germanium element and has topological semiconductor characteristics.

An array substrate, which includes the above-mentioned thin film transistor.

A display device, which includes the above-mentioned array substrate.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) into the scope sought for protection by the invention.

Figure 1:
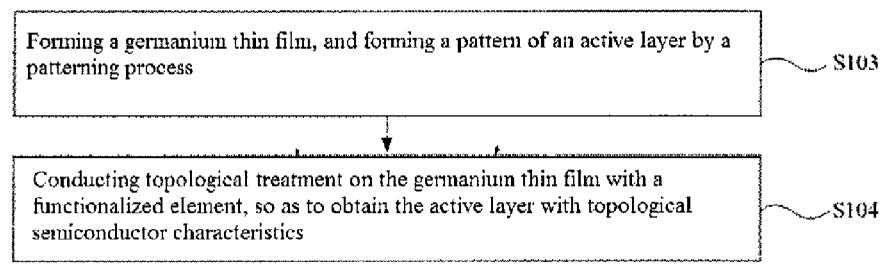
FIG. 1 is a flowchart illustrating a manufacturing method of an active layer in a thin film transistor provided by an embodiment of the invention.
Figure 2:
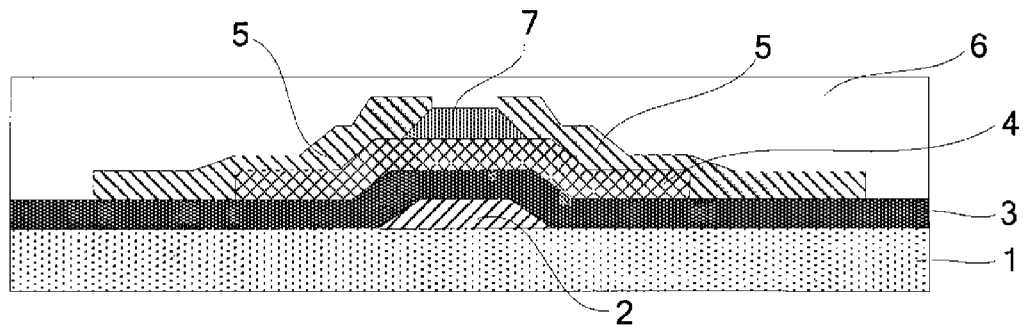
FIG. 2 is a structurally schematic view illustrating a thin film transistor provided by an embodiment of the invention.

Please refer to FIG. 1 and FIG. 2. FIG. 1 is a flowchart illustrating a manufacturing method of an active layer in a thin film transistor provided by an embodiment of the invention; FIG. 2 is a structurally schematic view illustrating a thin film transistor provided by an embodiment of the invention.

As illustrated in FIG. 1 and FIG. 2, regarding the manufacturing method of a thin film transistor provided by an embodiment of the invention, the method for manufacturing an active layer in the manufacturing method includes:

Step S103, a germanium thin film is formed, and a pattern of an active layer 4 is formed by a patterning process;

Step S104, a topological treatment is conducted on the germanium thin film with a functionalized element, so as to obtain the active layer 4 with topological semiconductor characteristics. For example, in the step, it is possible that the topological treatment is conducted on the germanium thin film in a predetermined region. In some examples, the topological treatment is conducted on the germanium thin film at least in a region where a channel is to be formed.

In the above manufacturing method of thin film transistor, by the step S104, a functionalized element is used to conduct a topological treatment on the germanium thin film, and the active layer 4 with topological semiconductor characteristics can be obtained. Due to possession of the topological semiconductor characteristics, the carrier mobility of the active layer 4 is very high, and the resistivity of source and drain electrodes is very low. Consequently, the carrier mobility of the thin film transistor obtained by using the above manufacturing method of thin film transistor is relatively high. Furthermore, the operating voltage will be very low as well.

In some examples, the topological germanium thin film also functions as a pixel electrode, a scan line, a data line and a peripheral wiring at the same time, and thereby, it is possible to reduce the signal delay effect and the heat loss effect and decrease the operating voltage of the device. This is propitious to simplification of the overall design and reduction of the overall power consumption.

Therefore, the carrier mobility of a thin film transistor obtained by the above manufacturing method of thin film transistor is relatively high, and its performance is better.

As illustrated in FIG. 1, in a specific embodiment, in the step S103, forming the germanium thin film, for example, may be achieved by the following methods:

Mode 1, the germanium thin film is formed by using an atomic layer deposition method;

Mode 2, the germanium thin film is formed by using a chemical vapor deposition method;

Mode 3, the germanium thin film is formed by using a mechanical stripping transfer method;

Mode 4, the germanium thin film is formed by using a magnetron sputtering process; and Mode 5, the germanium thin film is formed by using a pulsed laser deposition process.

As illustrated in FIG. 1, on the basis of the above embodiment, in a specific embodiment, in the step S104, the functionalized element may be such as fluorine element, chlorine element, bromine element or iodine element; conducting a topological treatment on the germanium thin film with a functionalized element so as to obtain the active layer 4 with topological semiconductor characteristics includes:

carrying out halogenation of the germanium thin film with the use of fluorine element, chlorine element, bromine element or iodine element, so as to obtain a halogenated germanium thin film. The halogenated germanium thin film has typical characteristics of topological semiconductor.

On the basis of the above embodiment, in a specific embodiment, the halogenated thin film may be a single-atomic-layer halogenated germanium thin film, or a double-atomic-layer halogenated germanium thin film, or a multiple-atomic-layer halogenated germanium thin film.

On the basis of the above two embodiments, in a specific embodiment, carrying out halogenation of the germanium thin film may be achieved by the following methods.

Mode 1, a gas phase method is used for carrying out halogenation of the germanium thin film.

For example, the above mode 1 may include that:

the germanium thin film is subjected to halogenation under an atmosphere of bromine gas, and when the gas pressure is in the range of 1 to 10 Pa, and the processing temperature is in the range of 50 to 400 degrees Celsius, the germanium thin film can be halogenated by bromine gas to form a germanium bromide thin film with topological semiconductor characteristics; or, the germanium thin film is subjected to annealing for 10 minutes under the following circumstances: in the atmosphere of chlorine gas, and the processing temperature of the range of 50 to 400 degrees Celsius, so as to form a germanium chloride thin film with topological semiconductor characteristics; or, the germanium thin film is subjected to halogenation under the atmosphere of iodine gas, the gas pressure being 1 to 10 Pa, and the processing temperature being 60 to 100 degrees Celsius, so as to form a germanium iodide thin film; or, the germanium thin film is subjected to halogenation under the atmosphere of $BCl_3$ gas, the gas pressure being 1 to 10 Pa, and the processing temperature being 250 to 350 degrees Celsius, and is subjected to annealing under the atmosphere of a halogen gas at the temperature of 90 to 130 degrees Celsius, so as to form a germanium chloride thin film with topological semiconductor characteristics.

Mode 2, a liquid phase method is used for carrying out halogenations.

For example, the above mode 2 may include that:

the germanium thin film is subjected to halogenation under the atmosphere of liquid bromine, and when concentration of the liquid bromine is in the range of 1% to 10% and the processing temperature is in the range of 40 to 80 degree Celsius, the germanium thin film can be halogenated by liquid bromine to form a germanium bromide thin film with topological semiconductor characteristics.

Mode 3, a surface modifying method is used for halogenation of germanium thin film.

For example, the above mode 3 may include that:

An organic colloidal material containing halogen is adopted. First of all, it is coated on a base, and after that, the base coated with the organic thin film is attached and pressed to a substrate on which a germanium thin film has been deposited, so that corresponding radicals containing halogen in the organic thin film are transferred to the germanium thin film by utilizing hydrophilic or hydrophobic property of radicals. Thus, the halogenating process of the germanium thin film is accomplished. The reaction in which a surface modifying method is used for topological treatment of the germanium thin film can be carried out under the condition that the temperature is close to room temperature.

Mode 4, a plasma treating method is used for halogenation of germanium thin film.

For example, the above mode 4 may include that:

The chlorine gas or carbon tetrachloride is used as the reactant gas, and in an equipment of inductively coupled plasma (ICP), reactive ion etching (RIE) or the like, halogen plasma will bombard a surface of the germanium thin film, and in turn, it may be absorbed in the germanium thin film. Thus, the halogenating process of the germanium thin film is accomplished. When a plasma treating process is used for topological treatment of germanium thin film, the treating temperature is relatively low, and a surface of the film layer can be made to be more uniform.

As illustrated in FIG. 2, after an active layer 4 of a thin film transistor (TFT) is prepared by using any of the above methods, an etch stopper layer 7 (about 50 nm) is produced at a desired zone by deposition, photolithography and etching; after that, 200 nm metal Mo or Al for source and drain electrodes is deposited by way of sputtering so as to form a source/drain electrode layer 5, and the desired pattern is produced by photolithography and etching of it; next, a $SiO_2$ passivation layer 6 (about 100 to 500 nm) is then fabricated by using a CVD method, and in turn, connecting holes are produced by photolithography and etching of it, for execution of a subsequent rear-panel process; after end of preparation of the TFT device, an ITO electrode may be deposited on it by sputtering, and pattern of a pixel region or a sub-pixel region is produced by photolithography and etching of it; finally, an acrylic material is spin-coated on the rear panel, and a pixel defining layer (about 1.5 μm) is produced by photolithography and solidification of it, ultimately forming a. TFT rear-panel portion. After completion of the rear panel, it can be further used for preparation of an OLED portion, so as to form an AMOLED display panel eventually. For example, it includes that, a surface of the rear panel is treated with $O_2$ plasma, so that the surface work function of ITO is further promoted, and moreover the surface layer is passivated; an organic material and a cathode metal thin layer are evaporated by thermal evaporation in a high vacuum system for deposition of OLED/EL-organic metal thin film; in the vacuum of $1\times10^{-5}$ Pa, a hole transportation layer (at a temperature of about 170° C.), an organic luminous layer and an electron transportation layer (at a temperature of about 190° C.) and a cathode (at a temperature of about 900° C.) are thermally evaporated in sequence. A 50 nm thick NPB (N,N,-diphenyl-N—N'-bis(1-naphthyl)-(1,1'-biphenyl)-4,4'diamine) is used for the hole transportation layer; the luminous layer is achieved by an evaporation process with a mask on a pixel region basis, and green, blue, and red pixel regions adopt host materials doped with phosphorescent materials, respectively: 25 nm thick CBP: (ppy)2Ir(acac), CBP:FIrpic and CBP:Btp2Ir(acac); 25 nm thick Bphen is used for the electron transportation layer; and an Sm/Al layer of about 200 nm thick is used for the cathode. The AMOLED device formed by fabrication shows full-color light emission, and the light extracting manner may be bottom light extraction.

In some example, an identical topological germanium thin film may be directly used for source and drain electrodes and a corresponding data line as well as a pixel electrode. As such, not only the process flow is decreased, but also a good array substrate is obtained.

As illustrated in FIG. 2, after an active layer 4 of a thin film transistor (TFT) is prepared by using any of the above methods, 200 nm metal Mo or Al for source and drain electrodes is then deposited by way of sputtering to form a source/drain electrode layer 5, and the desired pattern is produced by photolithography and etching of it; after that, a SiO$_2$ passivation layer 6 (about 100 to 500 nm) is prepared by using a CVD method, and in turn, connecting holes are produced by photolithography and etching of it, for execution of a subsequent rear panel process; in case that an ITO electrode is further sputtered and deposited on the TFT device, and a pattern of a pixel region or a sub-pixel region is produced by photolithography and etching of it, the portion of a TFT rear panel can be formed eventually; the rear panel can be used for manufacture of a LCD display panel, and its subsequent process includes photoresist coating and imprinting alignment layer, preparation of spacer and preparation of respective color filter substrate, as well as execution of cell-assembling, cutting, liquid crystal injection and glue sealing processes. The AMLCD device formed by manufacture may show full-color light emission.

It is to be noted that, in addition to fabrication of an active layer of a thin film transistor in accordance with embodiments of the invention, any suitable step, process, material and structure can be used for preparation of other components. In addition, the thin film transistor in accordance with embodiments of the invention is not limited to use for AMOLED display panels and AMLCD display panels, either, and may also be used in other structures in need of thin film transistors.

On the basis of the above embodiments, in some embodiments, the thickness range of the halogenated germanium thin film is 0.5 to 10 nm, that is, the thickness range of a germanium bromide thin film in mode 1 and a germanium chloride thin film in mode 2 in the above embodiments is 0.5 to 10 nm.

In some embodiments, the functionalized element may also be hydrogen element, nitrogen element, boron element, sulfur element or other non-metallic element.

In some embodiments, the thin film transistor may be a top-gate type structure, and may also be a bottom-gate type structure.

Figure 3:
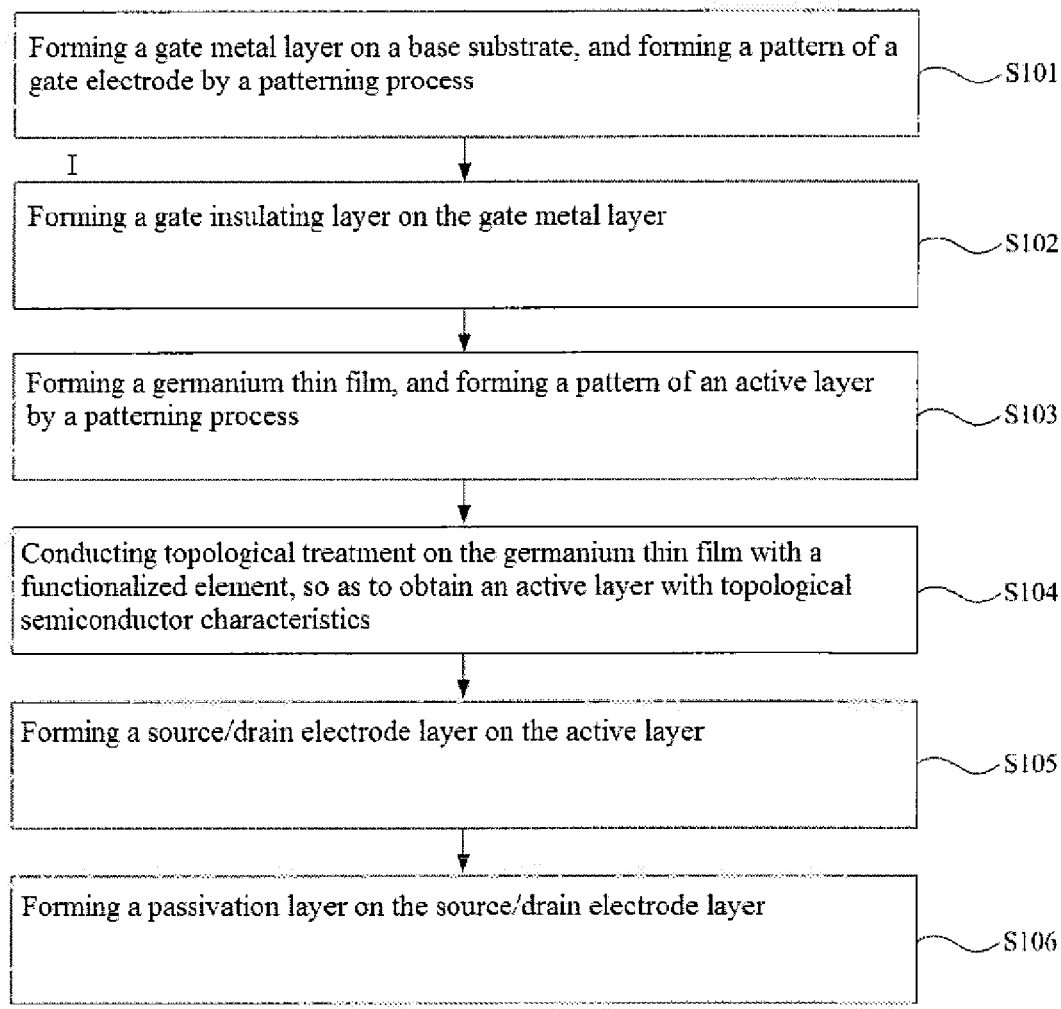
FIG. 3 is a flowchart illustrating a manufacturing method of a thin film transistor provided by an embodiment of the invention.

As illustrated in FIG. 3, when the thin film transistor is a bottom-gate type structure, prior to formation of a germanium thin film in the step S103, it further includes:

Step S101, a gate metal layer 2 is formed on a base substrate 1, and a pattern of a gate electrode is formed by a patterning process;

Step S102, a gate insulating layer 3 is formed on the gate metal layer 2.

After the topological treatment is conducted on the germanium thin film with a functionalized element so as to obtain the active layer 4 with topological semiconductor characteristics in the step S104, it further includes:

Step S105, a source/drain electrode layer 5 is formed on the active layer 4;

Step S106, a passivation layer 6 is formed on the source/drain electrode layer 5.

In some other embodiments in accordance with the invention, before formation of a germanium thin film in the step S103, the following steps are further included:

Step S101, a gate metal layer 2 is formed on a base substrate 1, and a pattern of a gate electrode is formed by a patterning process;

Step S102, a gate insulating layer 3 is formed on the gate metal layer 2.

At the same time that the topological treatment is conducted on the germanium thin film with a functionalized element so as to obtain the active layer 4 with topological semiconductor characteristics in the step S104, it further includes:

Step S105, the topological germanium thin film is used as source and drain electrodes;

Step S106, a passivation layer 6 is formed on the source/drain electrode layer 5;

Step S107, optionally, a pixel defining layer is formed on the passivation layer.

As illustrated in FIG. 2, a thickness of the gate metal layer is in the range of 1 nm to 500 nm; a material for the gate metal layer may be Mo, Al or Cr; a thickness of the gate insulating layer is in the range of 1 nm to 300 nm; a thickness of the source/drain electrode layer 5 is in the range of 5 nm to 500 nm; a material for the source/drain electrode layer 5 may be Mo, Al or Cr; and a thickness of the passivation layer 6 is in the range of 5 nm to 500 nm.

When the thin film transistor is a top-gate type structure, specific steps of forming the thin film transistor may include that, a buffer layer is prepared, a germanium thin film is prepared on the buffer layer and subjected to halogenation so as to form an active layer with topological semiconductor characteristics; a gate insulating layer is deposited on the active layer, a gate metal layer is deposited on the gate insulating layer and patterned, an insulating layer is deposited to isolate the gate metal layer from a source/drain metal layer; the source/drain metal layer is deposited and patterned, so as to form source and drain electrodes; and finally, a passivation layer is deposited.

In the above embodiments, manufacturing methods of thin film transistors have been described. However, according to embodiments of the invention, there is further provided a method for manufacturing an array substrate. In the course of manufacturing the array substrate, thin film transistors on the array substrate may be formed by using the above methods. Furthermore, the method of manufacturing the array substrate further includes steps of forming scan lines, data lines and other wirings (e.g. peripheral wirings), pixel electrodes and other components. For example, during manufacture of the array substrate in accordance with embodiments of the invention, at least one of an active layer, a source electrode and a drain electrode of a thin film transistor, a scan line, a data line and other wirings (e.g. peripheral wirings), and a pixel electrode may be formed by a topological germanium thin film, and regarding its specific forming steps, reference to the above steps of forming an active layer may be made. In addition, components formed by topological germanium thin films may be formed in the same layer.

In some embodiments, it is possible that all of the germanium thin films that have been patterned are topologized, and it is also possible that a part of the germanium thin films are topologized. For example, source and drain electrodes, a pixel electrode, a scan line, a data line and peripheral wirings, and a part of an active layer are topologized.

As illustrated in FIG. 2, according to an embodiment of the invention, there is further provided a thin film transistor, which includes an active layer 4 including a thin film that contains germanium element and has topological semiconductor characteristics. The thin film may be a halogenated germanium thin film as stated above, such as, a germanium bromide thin film, a germanium chloride thin film. Material for the active layer 4 of the above thin film transistor has topological semiconductor characteristics, and thus, the carrier mobility of the above thin film transistor is high. So, performance of the above thin film transistor is better.

In some embodiments, the thin film is a halogenated germanium thin film formed by halogenation of a germanium thin film with fluorine element, chlorine element, bromine element or iodine element.

In some embodiments, a thickness of the halogenated germanium thin film is in the range of 0.5 nm to 10 nm, and the halogenated germanium thin film may be a single-atomic-layer halogenated germanium thin film, a double-atomic-layer halogenated germanium thin film, or a multiple-atomic-layer halogenated germanium thin film.

In some other embodiments, the thin film is a topological semiconductor thin film formed by conduct a topological treatment on a germanium thin film with hydrogen element, nitrogen element, boron element or sulfur element.

In some embodiments, the thin film transistor is a top-gate type structure or a bottom-gate type structure.

In some embodiments, a thickness of the gate metal layer is in the range of 1 nm to 500 nm, and a material for the gate metal layer may be Mo, Al or Cr. A thickness of the source/drain electrode layer is in the range of 5 nm to 500 nm, and a material for the source/drain electrode layer is Mo, Al or Cr.

Inventive points are briefly introduced in embodiments of the invention, and there is no limitation on the specific structure of thin film transistors. Any existing thin film transistors that have been disclosed fall within the protection scope of the invention.

According to the invention, there is further provided an array substrate, which includes a thin film transistor provided by any of the above embodiments. The electron mobility of the thin film transistor of the array substrate is high, and thus, it can have a larger on-state current and a very high on/off ratio. So, the switching performance of the array substrate is good. As electron and hole mobility of the semiconductor material Ge itself are higher by one order of magnitude relative to those of Si under the same doping concentration, thin film transistors of the array substrate will have a higher carrier mobility, and can have a larger on-state current and a higher on/off ratio. Thus, switching performance of the array substrate is better as well. On the other hand, resistivity of the semiconductor surface is made to be zero with the aid of characteristics of topological semiconductor, while a material with low resistivity is very suitable for source and drain electrodes, wires and light-emitting electrodes, so that the signal delay effect and the heat loss effect can be reduced and the operating voltage of the device is decreased. Consequently, this is propitious to simplification of the overall design and reduction of the overall power consumption.

According to embodiments of the invention, a topological germanium thin film can be used for forming an active layer, source and drain electrodes, a pixel electrode, a scan line, a data line, peripheral wirings and so on; alternatively, it is used as an active layer and a certain part of the other at the same time, or used alone as an active layer. In addition, various components formed by the germanium thin film may be formed in the same layer.

Figure 4:
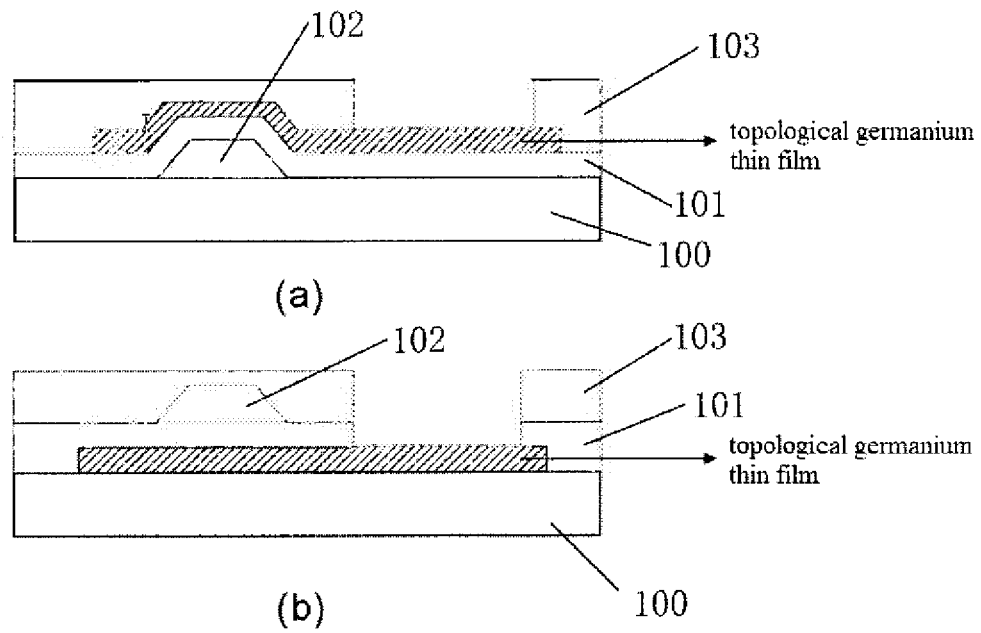
FIG. 4 is a structurally schematic view illustrating an array substrate provided by an embodiment of the invention.

In an example, as illustrated in FIGS. 4(a) and (b), thin film transistors with a top-gate configuration and a bottom-gate configuration are illustrated, respectively. Structure of the thin film transistors includes a substrate 100, a gate insulating layer 101, a gate electrode 102 and a passivation layer 103. The thin film transistor is formed on a substrate so as to form an array substrate. In the example, a source electrode, a drain electrode, and an active layer of a thin film transistor and a pixel electrode (the portion exposed by an opening part of the passivation layer 103) are all formed by a topological germanium thin film.

Figure 5:
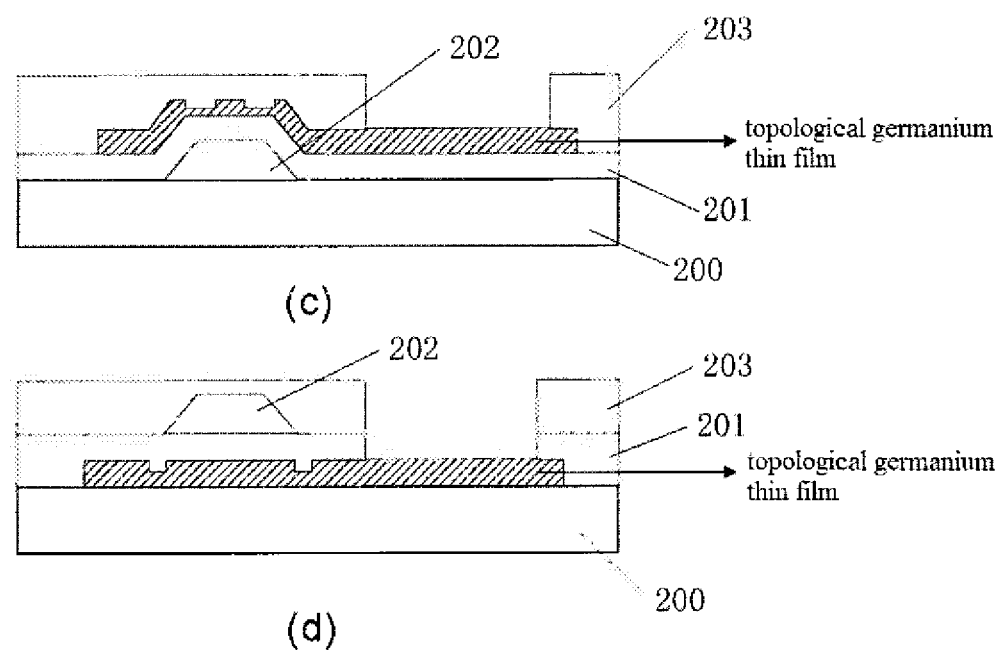
FIG. 5 is a structurally schematic view illustrating another array substrate provided by an embodiment of the invention.

In an example, as illustrated in FIGS. 5(a) and (b), thin film transistors with a top-gate configuration and a bottom-gate configuration are illustrated, respectively. The structure of the thin film transistors includes a substrate 200, a gate insulating layer 201, a gate electrode 202 and a passivation layer 203. The thin film transistor is formed on a substrate so as to form an array substrate. In the example, a source electrode, a drain electrode and an active layer of a thin film transistor and a pixel electrode (the portion exposed by an opening part of the passivation layer 203) are all formed by a topological germanium thin film. In addition, in the example, a region of the topological germanium thin film opposed to the gate electrode is formed to have different thicknesses.

According to the invention, there is further provided a display device, which includes the array substrate provided by the above embodiments. Display switching performance of the display device is good, and the picture switching is rapid.

Descriptions made above are merely exemplary embodiments of the invention, but are not used to limit the protection scope of the invention. The protection scope of the invention is determined by the attached claims.

This application claims the benefit of priority from Chinese patent application No. 201410727563.0, filed on Dec. 3, 2014, the disclosure of which is incorporated herein in its entirety by reference as a part of the present application.

The invention claimed is:

1. A manufacturing method of a thin film transistor, comprising:
    forming a germanium thin film, and forming a pattern of the active layer through a patterning process; and
    conducting a topological treatment on the germanium thin film with a functionalized element, so as to obtain the active layer,
    the functionalized element is at least one selected from the group consisting of fluorine element, chlorine element, bromine element and iodine element, and conducting the topological treatment on the germanium thin film with the functionalized element so as to obtain the active layer includes:
    performing halogenation of the germanium thin with the functionalized element, so as to obtain a halogenated germanium thin film.

2. The manufacturing method according to claim 1, further comprising steps of forming a source electrode and a drain electrode, wherein, at least one of the source electrode and the drain electrode is formed in such a way that a patterning process is performed on the germanium thin film and a topological treatment is conducted on the germanium thin film with the functionalized element.

3. The manufacturing method according to claim 1, wherein, at least one selected from the group consisting of a vapor phase method, a liquid phase method, a surface modifying method and a plasma treating method is used for halogenation of the germanium thin film.

4. The manufacturing method according to claim 3, wherein, the vapor phase method is used for halogenation of the germanium thin film, and performing halogenation of the germanium thin film includes:
    performing halogenation of the germanium thin film under an atmosphere of bromine gas, a gas pressure being 1 to 10 Pa, and a processing temperature being 50 to 400 degrees Celsius, so as to form the halogenated germanium thin film; or, conducting annealing of the germanium thin film for 10 minutes under the following circumstances: in an atmosphere of chlorine gas, and a processing temperature in a range of 50 to 400 degrees Celsius, so as to form a germanium chloride thin film; or, performing halogenation of the germanium thin film under an atmosphere of iodine gas, a gas pressure being 1 to 10 Pa, and a processing temperature being 60 to 100 degrees Celsius, so as to form a germanium iodide thin film.

5. The manufacturing method according to claim 3, wherein, the vapor phase method is used for halogenation of the germanium thin film, and performing halogenation of the germanium thin film includes:

performing halogenation of the germanium thin film under an atmosphere of $BCl_3$ gas, a gas pressure being 1 to 10 Pa, and a processing temperature being 250 to 350 degrees Celsius, and conducting annealing under an atmosphere of a halogen gas at a temperature of 90 to 130 degrees Celsius, so as to form a germanium chloride thin film.

6. The manufacturing method according to claim 3, wherein, the liquid phase method is used for halogenation of the germanium thin film, and performing halogenation of the germanium thin film includes: performing halogenations of the germanium thin film under an atmosphere of liquid bromine, concentration of the liquid bromine being in the range of 1% to 10% and a processing temperature being in a range of 40 to 80 degree Celsius, so as to form a germanium bromide thin film.

7. The manufacturing method according to claim 3, wherein, the surface modifying method is used for halogenation of the germanium thin film, and performing halogenation of the germanium thin film includes: coating an organic colloidal material containing halogen on a base, and attaching and pressing one side of the base coated with the organic colloidal material to the germanium thin film, so that halogen atoms in the organic colloid are transferred to the germanium thin film, and thus halogenation of the germanium thin film is achieved.

8. The manufacturing method according to claim 3, wherein, the plasmas treating method is used for halogenation of the germanium thin film, and performing halogenation of the germanium thin film includes: in an equipment of inductively coupled plasma or reactive ion etching, bombarding a surface of the germanium thin film with halogen plasma, so that halogen plasma is absorbed in the germanium thin film, and thus halogenation of the germanium thin film is achieved.

9. A thin film transistor, including an active layer, which includes a thin film that contains germanium element, and the thin film is a halogenated germanium thin film.

10. The thin film transistor according to claim 9, wherein, a source electrode and a drain electrode of the thin film transistor are formed by a thin film that contains germanium element.

11. The thin film transistor according to claim 10, wherein, the source electrode, the drain electrode and the active layer of the thin film transistor are located on a same layer.

12. The thin film transistor according to claim 9, wherein, a thickness of the halogenated germanium thin film is in a range of 0.5 to 10 nm.

13. The thin film transistor according to claim 9, wherein, the halogenated thin film is a single-atomic-layer halogenated germanium thin film, a double-atomic-layer halogenated germanium thin film, or a multiple-atomic-layer halogenated germanium thin film.

14. An array substrate, comprising the thin film transistor according to claim 9.

15. The array substrate according to claim 14, further comprising a scan line, a data line and a pixel electrode, and at least one of the scan line, the data line and the pixel electrode is formed by a thin film that contains germanium element.

16. A display device, comprising the array substrate according to claim 14.

* * * * *